United States Patent [19]
Yamaguchi

[11] Patent Number: 5,652,532
[45] Date of Patent: Jul. 29, 1997

[54] FREQUENCY DIFFERENCE DETECTION APPARATUS

[75] Inventor: Shigenori Yamaguchi, Tokyo, Japan

[73] Assignee: NEC Corporation, Tokyo, Japan

[21] Appl. No.: 645,220

[22] Filed: May 13, 1996

[30] Foreign Application Priority Data

May 16, 1995 [JP] Japan .................................. 7-117226

[51] Int. Cl.$^6$ ...................................................... G01R 23/02
[52] U.S. Cl. ............................ 327/39; 327/42; 327/2
[58] Field of Search ................................ 327/39–41, 2, 327/7, 44, 147–150, 156–159, 162, 163

[56] References Cited

U.S. PATENT DOCUMENTS

| | | | |
|---|---|---|---|
| 4,686,482 | 8/1987 | Zoetman et al. | 327/156 |
| 5,463,351 | 10/1995 | Marko et al. | 327/159 |
| 5,473,285 | 12/1995 | Nuckolls et al. | 327/156 |
| 5,534,823 | 7/1996 | Kondou | 327/159 |

FOREIGN PATENT DOCUMENTS 4-316213  11/1992  Japan .

Primary Examiner—Toan Tran
Attorney, Agent, or Firm—Young & Thompson

[57] ABSTRACT

A frequency difference detection apparatus includes a first PLL, a second PLL, a first phase difference detection unit, a second phase difference detection unit, a phase difference processing unit, and a frequency difference detection unit. The first PLL detects a phase difference between an input clock and an output clock in response to the input clock and performs control to gradually suppress the detected phase difference to zero. The second PLL detects a phase difference between the input clock and an output clock in response to the input clock and performs control to suppress the detected phase difference to zero at a speed higher than that of the first PLL. The first phase difference detection unit detects a phase difference between the input clock and the output clock from the first PLL. The second phase difference detection unit detects a phase difference between the input clock and the output clock from the second PLL. The phase difference processing unit processes a detection of a difference between the phase differences detected by the first and second phase difference detection units. The frequency difference detection unit detects a frequency difference between the input clock and a reference frequency from a detection output from the phase difference processing unit.

6 Claims, 2 Drawing Sheets

FREQUENCY DIFFERENCE DETECTION APPARATUS

BACKGROUND OF THE INVENTION

The present invention relates to a frequency difference detection apparatus suitable to detect a shift, from a reference frequency, of a highly precise clock input to a network synchronization unit.

A frequency difference detection circuit shown in FIG. 2 is conventionally known. This circuit comprises a single PLL (Phase Locked Loop) 50, a phase difference detection unit 52, and a frequency difference detection unit 54, as described in, e.g., Japanese Patent Laid-Open No. 4-316213. The PLL 50 generates an output clock 202 based on an input reference clock 200 in response to this reference clock 200. At the same time, the PLL 50 detects the phase difference between the reference clock 200 and the output clock 202 and performs control to suppress the phase difference to zero, thereby outputting the output clock 202 phase-locked with the reference clock 200. More specifically, the PLL 50 generates the output clock 202 having a certain phase difference from the reference clock 200 and highly stably frequency-synchronized, phase-locked with the reference clock 200. The phase difference detection unit 52 detects the phase difference between the reference clock 200 and the output clock 202 and outputs the detection output to the frequency difference detection unit 54. The frequency difference detection unit 54 receives as time series data the phase difference detected by the phase difference detection unit 52 and analyzes this time series data, thereby detecting the shift of the reference clock 200 from a nominal frequency.

In the frequency difference detection circuit shown in FIG. 2, even when the phase difference between the reference clock 200 and the output clock 202 fluctuates within the phase error range of the PLL 50 in the frequency-synchronized, phase-locked state, the detection output from the phase difference detection unit 52 is averaged using a statistical method, and at the same time, the high stability of the PLL 50 is used, so that the variation in reference clock 200 can be absorbed for a long time of period.

In the conventional frequency difference detection circuit, however, the detectable frequency difference and detection time are limited by the steady-state phase error and follow-up characteristics of the PLL 50.

SUMMARY OF THE INVENTION

It is an object of the present invention to provide a frequency difference detection circuit capable of increasing the detection sensitivity for a frequency difference and shortening the frequency difference detection time.

In order to achieve the above object, according to the present invention, there is provided a frequency difference detection apparatus comprising a first phase locked loop (PLL) for detecting a phase difference between an input clock and an output clock in response to the input clock and performing control to gradually suppress the detected phase difference to zero, a second PLL for detecting a phase difference between the input clock and an output clock in response to the input clock and performing control to suppress the detected phase difference to zero at a speed higher than that of the first PLL, first phase difference detection means for detecting a phase difference between the input clock and the output clock from the first PLL, second phase difference detection means for detecting a phase difference between the input clock and the output clock from the second PLL, phase difference processing means for processing a detection of a difference between the phase differences detected by the first and second phase difference detection means, and frequency difference detection means for detecting a frequency difference between the input clock and a reference frequency from a detection output from the phase difference processing means.

DESCRIPTION OF THE PREFERRED EMBODIMENT

An embodiment of the present invention will be described below in detail.

Figure 1:
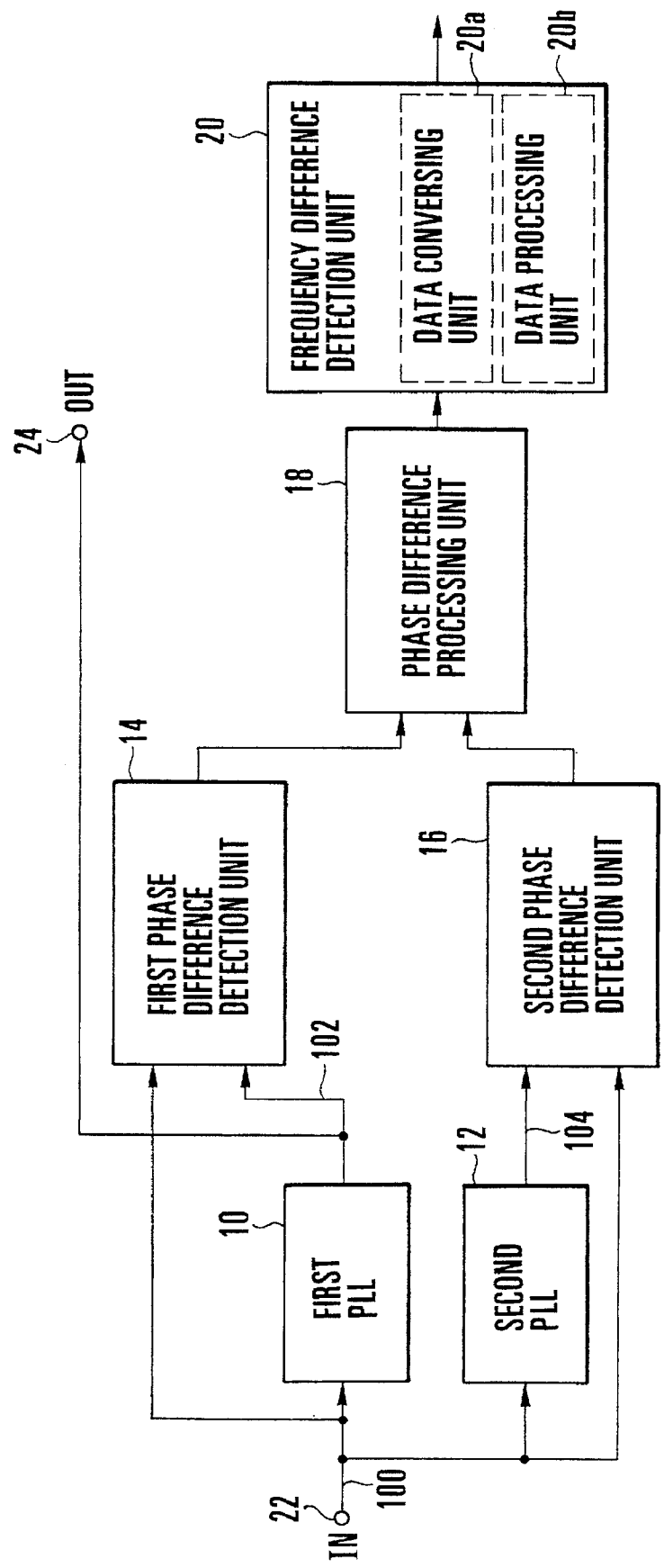
FIG. 1 is a block diagram showing the overall arrangement of a frequency difference detection circuit according to an embodiment of the present invention.
Figure 2:
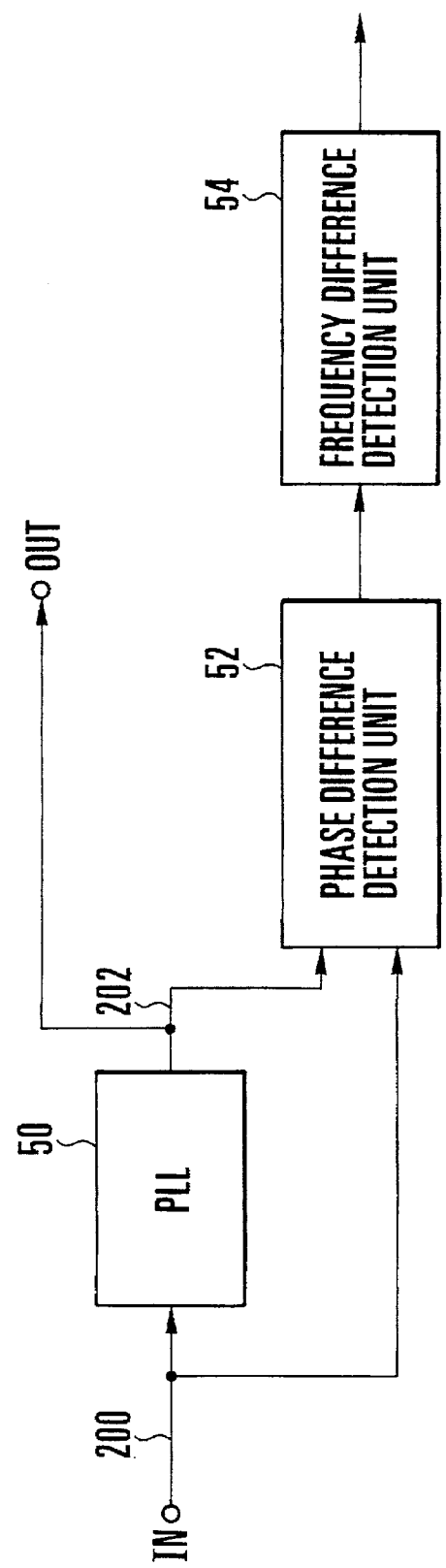
FIG. 2 is a block diagram showing the overall arrangement of a conventional frequency difference detection circuit.

FIG. 1 shows the overall arrangement of a frequency difference detection circuit according to an embodiment of the present invention.

Referring to FIG. 1, the frequency difference detection circuit comprises a first phase locked loop unit (to be referred to as a first PLL hereinafter) 10 connected to an input terminal 22, a second phase locked loop unit (to be referred to as a second PLL hereinafter) 12 connected to the input terminal 22, a first phase difference detection unit 14 connected to the input terminal 22 and the output terminal of the first PLL 10, a second phase difference detection unit 16 connected to the input terminal 22 and the output terminal of the second PLL 12, a phase difference processing unit 18 connected to the output terminals of the first and second phase difference detection units 14 and 16, and a frequency difference detection unit 20 connected to the output terminal of the phase difference processing unit 18. The frequency difference detection unit 20 has a data conversion unit 20a for converting a detection output from the phase difference processing unit 18 into time series data, and a data processing unit 20b for performing statistical processing of the time series data output from the data conversion unit 20a to detect the frequency difference between an input clock and a reference frequency.

When an input clock 100 serving as a highly precise reference clock input to a network synchronization unit is input to the input terminal 22, the first PLL 10 generates an output clock 102 based on the input clock 100 in response to this input clock 100. At this time, the first PLL 10 detects the phase difference between the input clock 100 and the output clock 102, and performs control to sequentially suppress the phase difference to zero, thereby absorbing the fluctuation in input clock 100 and generating the highly stable output clock 102. The output clock 102 is output to an output terminal 24 and the first phase difference detection unit 14. The first phase difference detection unit 14 detects the phase difference between the input clock 100 and the output clock 102 in response to the leading edges of the input clock 100 and the output clock 102 and outputs the detected phase difference to the phase difference processing unit 18.

On the other hand, the second PLL 12 generates an output clock 104 based on the input clock 100 in response to the input clock 100. At this time, the second PLL 12 detects the phase difference between the input clock 100 and the output clock 104 and performs control to suppress the phase difference to zero at a speed higher than that of the first PLL 10, thereby generating the output clock 104 immediately responding to the variation in input clock 100. The output clock 104 is output to the second phase difference detection unit 16. The second phase difference detection unit 16 detects the phase difference between the input clock 100 and the output clock 104 in response to the leading edges of the input clock 100 and the output clock 104 and outputs the detection output to the phase difference processing unit 18.

The phase difference processing unit 18 detects the difference between the phase difference detected by the first phase difference detection unit 14 and the phase difference detected by the second phase difference detection unit 16. The phase difference processing unit 18 can be realized by, e.g., a processor which receives outputs from the first phase difference detection unit 14 and the second phase difference detection unit 16 as port data and performs algebraic processing of these port data.

The frequency difference detection unit 20 converts the detection output from the phase difference processing unit 18 into time series data by using the data conversion unit 20a and performs statistical processing of the converted time series data by using the data processing unit 20b, thereby detecting the frequency difference between the input clock 100 and the reference frequency (nominal frequency). The data processing unit 20b of the frequency difference detection unit 20 can be realized by a processor incorporating the program of a statistical method. By using the statistical method, the frequency difference detection unit 20 can eliminate the uncertainty of the frequency difference caused by the fluctuation of the first and second PLLs 10 and 12.

The operation of the frequency difference detection circuit with the above arrangement will be described below. When the input clock 100 is input to the input terminal 22, the highly stable output clock 102 which has absorbed the fluctuation in input clock 100 is generated by the first PLL 10. On the other hand, the output clock 104 sensitively responding to the variation in input clock 100 is generated by the second PLL 12. The first phase difference detection unit 14 detects the phase difference between the input clock 100 and the output clock 102 while the second phase difference detection unit 16 detects the phase difference between the input clock 100 and the output clock 104. Thereafter, the difference between the phase difference from the first PLL 10 and the phase difference from the second PLL 12 is detected by the phase difference processing unit 18. The frequency difference detection unit 20 converts the difference between the phase differences into time series data and performs statistical processing of the converted time series data. A signal representing the frequency difference between the input clock 100 and the reference frequency is output from the frequency difference detection unit 20.

In this case, the system mainly constituted by the first PLL 10 absorbs the fluctuation in input clock 100 for a long time of period. The system mainly constituted by the second PLL 12 immediately absorbs the variation in input clock 100.

As has been described above, according to the present invention, the difference in characteristics between the first PLL 10 and the second PLL 12 is used to detect the phase difference between the input clock 100 and the reference frequency on the basis of the fluctuation or variation in input clock 100. For this reason, the detection sensitivity for the frequency difference can be increased, and the frequency difference detection time can be shortened.

What is claimed is:

1. A frequency difference detection apparatus comprising:
   a first phase locked loop (PLL) for detecting a phase difference between an input clock and an output clock in response to the input clock and performing control to gradually suppress the detected phase difference to zero;
   a second PLL for detecting a phase difference between the input clock and an output clock in response to the input clock and performing control to suppress the detected phase difference to zero at a speed higher than that of said first PLL;
   first phase difference detection means for detecting a phase difference between the input clock and the output clock from said first PLL;
   second phase difference detection means for detecting a phase difference between the input clock and the output clock from said second PLL;
   phase difference processing means for processing a detection of a difference between the phase differences detected by said first and second phase difference detection means; and
   frequency difference detection means for detecting a frequency difference between the input clock and a reference frequency from a detection output from said phase difference processing means.

2. An apparatus according to claim 1, wherein said frequency difference detection means comprises data conversion means for converting the detection output from said phase difference processing means into time series data and detects the frequency difference between the input clock and the reference frequency by analyzing the time series data converted by said data conversion means.

3. An apparatus according to claim 2, wherein said frequency difference detection means comprises data processing means for performing statistical processing of the time series data output from said data conversion means to detect the frequency difference between the input clock and the reference frequency.

4. An apparatus according to claim 3, wherein said phase difference processing means and said data processing means are constituted by processors which perform a detection processing of a difference between phase differences and data processing, respectively, by executing programs.

5. An apparatus according to claim 1, wherein said first PLL generates a highly stable output clock by absorbing a fluctuation in input clock, and said second PLL generates the output clock immediately responding to a variation in the input clock.

6. A frequency difference detection apparatus comprising:
   a first phase locked loop (PLL) for detecting a phase difference between an input clock and an output clock in response to the input clock and generating a highly stable output clock by absorbing a fluctuation in input clock to gradually suppress the detected phase difference to zero;
   a second PLL for detecting a phase difference between the input clock and an output clock in response to the input clock and generating the output clock immediately responding to a variation in the input clock by suppressing the detected phase difference to zero at a speed higher than that of said first PLL;
   first phase difference detection means for detecting a phase difference between the input clock and the output clock from said first PLL;
   second phase difference detection means for detecting a phase difference between the input clock and the output clock from said second PLL;

phase difference processing means for processing a detection of a difference between the phase differences detected by said first and second phase difference detection means; and frequency difference detection means for detecting a frequency difference between the input clock and a reference frequency from a detection output from said phase difference processing means, said frequency difference detection means comprising data conversion means for converting the detection output from said phase difference processing means into time series data, and data processing means for performing statistical processing of the time series data output from said data conversion means to detect the frequency difference between the input clock and the reference frequency.

* * * * *